United States Patent
Peng et al.

(10) Patent No.: US 10,825,888 B2
(45) Date of Patent: Nov. 3, 2020

(54) 3-DIMENSIONAL PRINTING PROCESS FOR INTEGRATED MAGNETICS

(71) Applicant: GLOBALFOUNDRIES Singapore Pte. Ltd., Singapore (SG)

(72) Inventors: Lulu Peng, Singapore (SG); Donald Ray Disney, Singapore (SG); Lawrence Selvaraj Susai, Singapore (SG); Rajesh Sankaranarayanan Nair, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 16/454,602

(22) Filed: Jun. 27, 2019

(65) Prior Publication Data

US 2019/0319085 A1   Oct. 17, 2019

Related U.S. Application Data

(62) Division of application No. 15/473,564, filed on Mar. 29, 2017, now Pat. No. 10,446,639.

(51) Int. Cl.
*H01L 21/3205* (2006.01)
*H01L 23/522* (2006.01)
(Continued)

(52) U.S. Cl.
CPC ............ *H01L 28/10* (2013.01); *B22F 3/1055* (2013.01); *B23K 15/0086* (2013.01);
(Continued)

(58) Field of Classification Search
CPC ............... H01L 28/10; H01L 21/32051; H01L 21/02118; H01L 21/268; H01L 21/02354;
(Continued)

(56) References Cited

U.S. PATENT DOCUMENTS

| | | |
|---|---|---|
| 5,583,474 A | 12/1996 | Mizoguchi et al. |
| 2003/0162179 A1 | 8/2003 | Potyrailo et al. |
| 2016/0045981 A1 | 2/2016 | Zurecki et al. |

OTHER PUBLICATIONS

Wei Liang et al., "3D Printed Air Core Inductors for High Frequency Power Converters", IEEE Transactions on Power Electronics, 2014, pp. 971-979, vol. 31, No. 1.
(Continued)

*Primary Examiner* — Laura M Menz
*Assistant Examiner* — Candice Chan
(74) *Attorney, Agent, or Firm* — Thompson Hine LLP; Francois Pagette

(57) ABSTRACT

Integrated circuits (ICs) and method for forming IC devices are presented. In one embodiment, a method of forming a device with an integrated magnetic component using 3-dimensional (3-D) printing is disclosed. The method includes providing a substrate with a base dielectric layer, the base dielectric layer serves as a base for the integrated magnetic component. A first metal layer is formed on the substrate by spray coating metal powder over the substrate and performing selective laser melting on the metal powder. A magnetic core is formed on the substrate by spray coating magnet powder over the substrate and performing selective laser sintering on the magnet powder. A second metal layer is formed on the substrate by spray coating metal powder over the substrate and performing selective laser melting on the metal powder. A patterned dielectric layer separates the first and second metal layers and the magnetic core.

14 Claims, 13 Drawing Sheets

(51) Int. Cl.

| | |
|---|---|
| *H01L 49/02* | (2006.01) |
| *B33Y 10/00* | (2015.01) |
| *B22F 3/105* | (2006.01) |
| *B23K 26/342* | (2014.01) |
| *B23K 26/00* | (2014.01) |
| *B33Y 80/00* | (2015.01) |
| *B23K 26/08* | (2014.01) |
| *B23K 15/00* | (2006.01) |
| *B23K 26/082* | (2014.01) |
| *B29C 64/153* | (2017.01) |
| *C23C 24/10* | (2006.01) |
| *H01F 17/00* | (2006.01) |
| *H01F 41/04* | (2006.01) |
| *H01F 41/16* | (2006.01) |
| *H01F 41/22* | (2006.01) |
| *B29K 79/00* | (2006.01) |
| *B29L 31/34* | (2006.01) |
| *B23K 101/40* | (2006.01) |
| *B23K 103/16* | (2006.01) |
| *B23K 101/42* | (2006.01) |
| *B23K 103/12* | (2006.01) |

(52) U.S. Cl.
CPC ...... *B23K 15/0093* (2013.01); *B23K 26/0006* (2013.01); *B23K 26/082* (2015.10); *B23K 26/0876* (2013.01); *B23K 26/342* (2015.10); *B29C 64/153* (2017.08); *B33Y 10/00* (2014.12); *B33Y 80/00* (2014.12); *C23C 24/106* (2013.01); *H01F 17/0006* (2013.01); *H01F 17/0013* (2013.01); *H01F 17/0033* (2013.01); *H01F 41/046* (2013.01); *H01F 41/16* (2013.01); *H01F 41/22* (2013.01); *H01L 21/32051* (2013.01); *H01L 23/5227* (2013.01); *B22F 2998/10* (2013.01); *B23K 2101/40* (2018.08); *B23K 2101/42* (2018.08); *B23K 2103/12* (2018.08); *B23K 2103/172* (2018.08); *B29K 2079/08* (2013.01); *B29K 2995/0006* (2013.01); *B29K 2995/0008* (2013.01); *B29L 2031/34* (2013.01); *C22C 2202/02* (2013.01); *H01F 2017/0066* (2013.01)

(58) Field of Classification Search
CPC ............... H01F 24/255; H01F 24/2804; H01F 2027/2809–2819; H01F 27/255; H01F 27/2804; H01F 41/042; H01F 41/22; H01F 41/16; B33F 3/1055; B33Y 10/00
See application file for complete search history.

(56) References Cited

OTHER PUBLICATIONS

Dok Won Lee et al., "Fabrication and Analysis of High-Performance Integrated Solenoid Inductor With Magnetic Core", IEEE Transactions on Magnetics, Nov. 2008, pp. 4089-4095, vol. 44, No. 11.

200

200

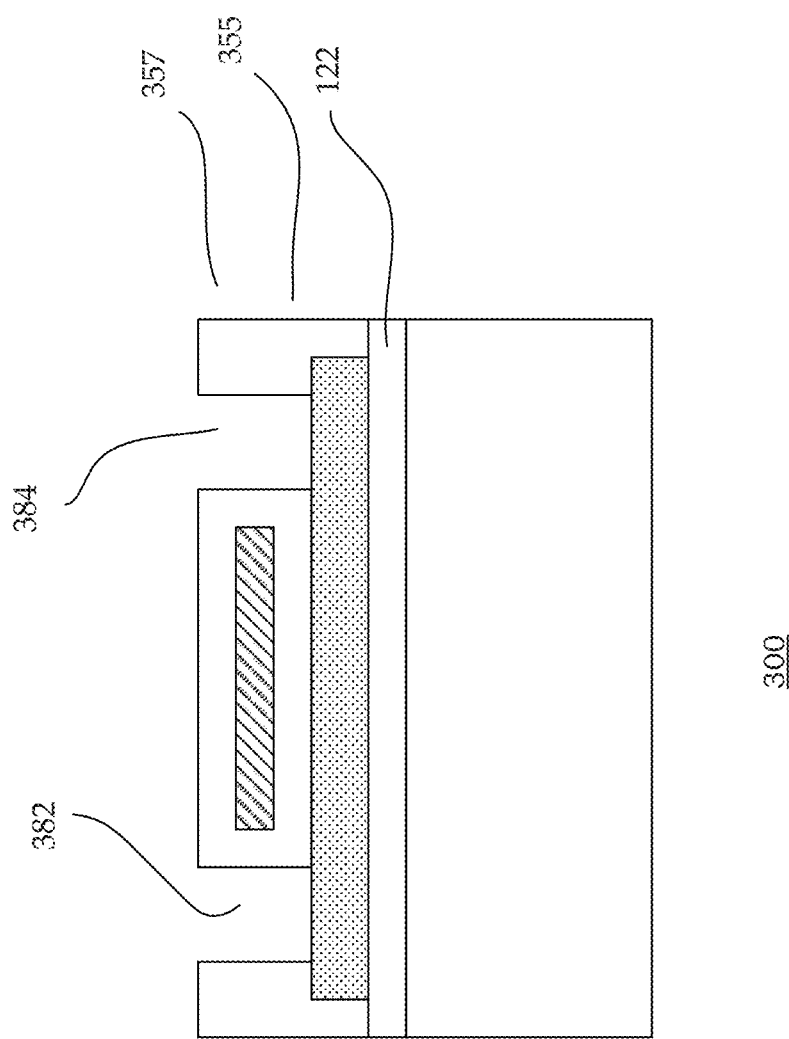

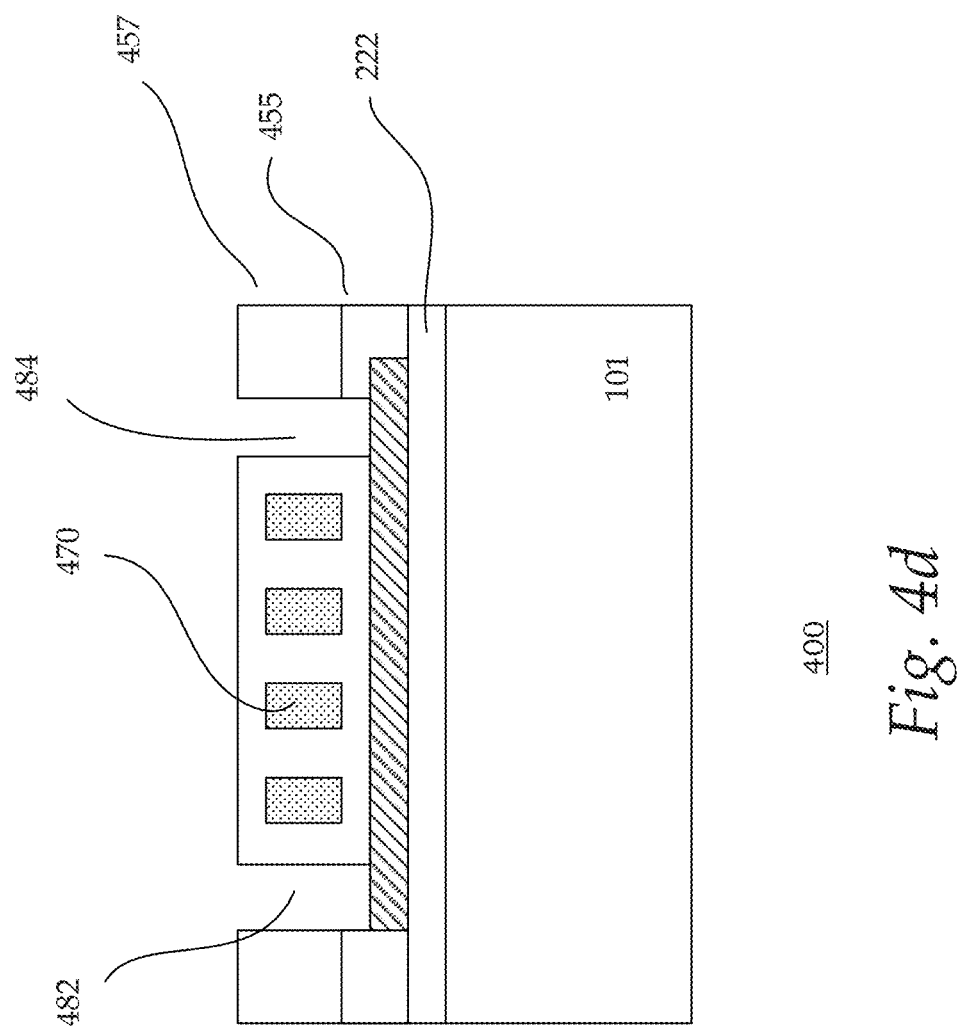

3-DIMENSIONAL PRINTING PROCESS FOR INTEGRATED MAGNETICS

BACKGROUND

Power management integrated circuits (PMICs) are employed for managing the power requirements of devices. For example, PMICs are employed to perform power conversion and power control functions. Some PMIC chips incorporate discrete magnetic devices for high frequency power conversion applications. The magnetic devices often occupy about 2 to 3 times the area of a PMIC itself. In order to reduce the whole package size, integrated thin-film magnetics are developed using standard CMOS manufacturing processes.

However, the present processes for fabricating integrated thin-film magnetics yield devices with geometric constraints and limited cross section aspect ratio. For instance, the metal thickness and magnetic core thickness are limited to a few μm (e.g., 2 to 5 μm). The limited thickness usually results in large DC resistance (e.g., more than 1Ω), and low quality factor (e.g., less than 10).

From the foregoing discussion, it is desirable to provide a process for forming integrated magnetic devices which solves the above-mentioned problems.

SUMMARY

Embodiments generally relate to integrated circuits (ICs) or semiconductor devices and methods for forming the ICs. In one embodiment, a method of forming a device with an integrated magnetic component using 3-dimensional (3-D) printing is disclosed. The method includes providing a substrate with a base dielectric layer, the base dielectric layer serves as a base for the integrated magnetic component. A first metal layer is formed on the substrate by spray coating metal powder over the substrate and performing selective laser melting on the metal powder. A magnetic core is formed on the substrate by spray coating magnet powder over the substrate and performing selective laser sintering on the magnet powder. A second metal layer is formed on the substrate by spray coating metal powder over the substrate and performing selective laser melting on the metal powder. A patterned dielectric layer separates the first and second metal layers and the magnetic core.

In yet another embodiment, a method of forming a device with an integrated magnetic component using 3-dimensional (3D) printing is presented. The method includes providing a substrate with a base dielectric layer, the base dielectric layer serves as a base for the integrated magnetic component. A first layer of a magnetic core is formed on the substrate by spray coating magnet powder over the substrate and performing selective laser sintering on the magnet powder. Metal windings are formed on the substrate by spray coating metal powder over the substrate and performing selective laser melting on the metal powder. A second layer of the magnetic core is formed on the substrate by spray coating magnet powder over the substrate and performing selective laser sintering on the magnet powder. A patterned dielectric layer separates the first and second layers of the magnetic core and the metal windings.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 3a-3f show cross-sectional views of an exemplary process for forming a device; and FIGS. 4a-4e show cross-sectional views of an exemplary process for forming a device.

DETAILED DESCRIPTION

Embodiments generally relate to integrated circuit (IC) devices and processes for forming IC devices. More particularly, some embodiments relate to processes for forming integrated magnetic devices, such as integrated inductors or transformers. The devices may include other types of circuit components. In one embodiment, a three-dimensional (3-D) printing process is employed to form the integrated magnetic devices. The devices or ICs can be incorporated into or used with, for example, consumer electronic products, and particularly portable electronic devices such as, for example, mobile phones, tablets, and PDAs.

Figure 1A:
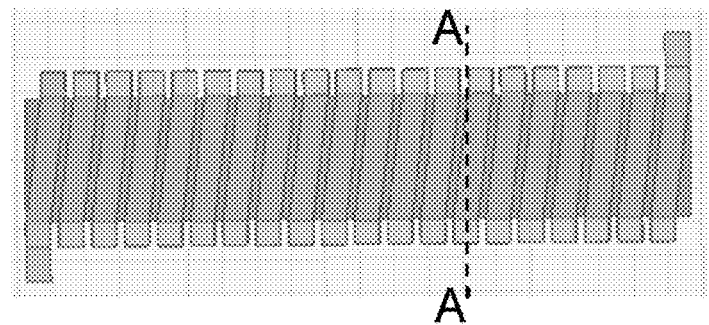
FIGS. 1a-1b show top and cross-sectional views of a portion of an embodiment of a device.
Figure 1B:
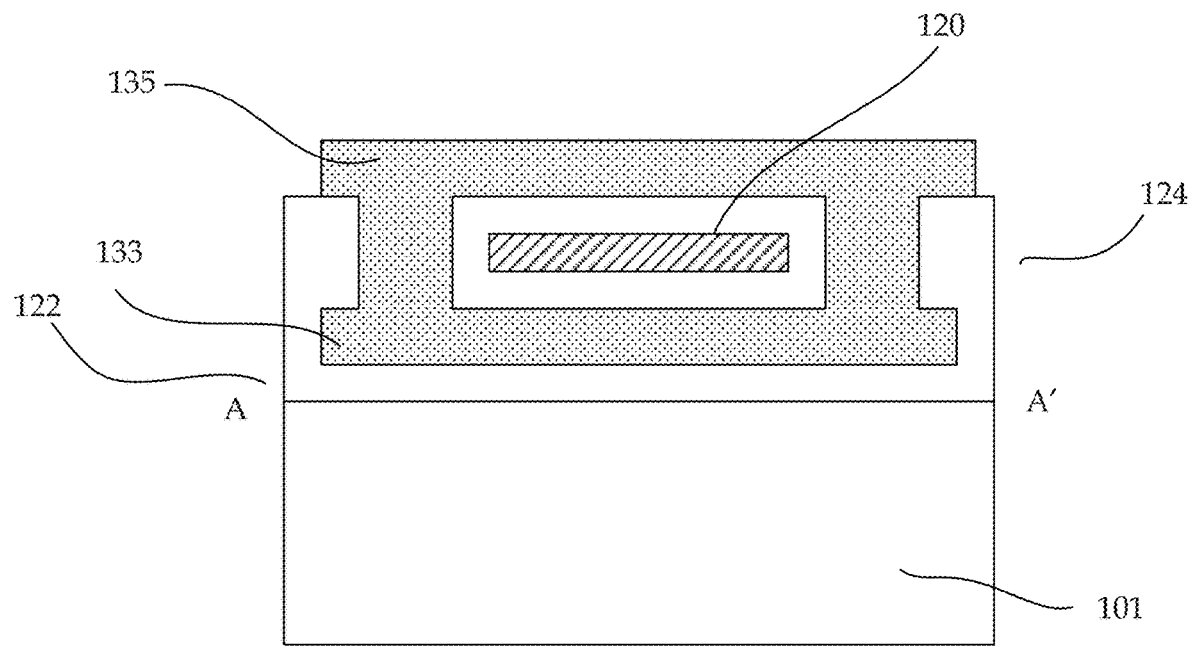

FIGS. 1a-1b show top and cross-sectional views of a portion of an embodiment of a device 100 respectively. The device, in one embodiment, is an integrated magnetic device. Other types of devices may also be useful. As illustrated, the integrated magnetic device includes a solenoid or toroid design. The magnetic device, for example, is an integrated inductor. The device includes a substrate 101. The substrate, for example, is a silicon substrate. Other suitable types of substrates, such as silicon germanium, germanium, gallium arsenide, or crystal-on-insulator (COI) such as silicon-on-insulator (SOI), are also useful. The substrate may include logic components such as complementary metal oxide semiconductor (CMOS) transistors. The logic components may be formed using front-end-of-line (FEOL) CMOS logic processes.

A base dielectric layer 122 may be disposed on the substrate. The base dielectric layer may be part of a back-end-of-line (BEOL) dielectric layer. A BEOL dielectric layer may include a plurality of inter-level dielectric layers (ILDs). An ILD layer includes a via level dielectric layer below a metal level dielectric layer. The via level and metal level dielectric layers may be silicon oxide layers formed by chemical vapor deposition (CVD). Contacts are formed in the via level dielectric layer while metal lines are formed in the metal level dielectric layer. The contacts and metal lines may be formed of tungsten or copper.

An ILD level may be formed by single damascene, dual damascene or reactive ion etch (RIE) or a combination of different processes. In the case of single damascene processes, the via contacts and metal lines need not be formed of the same material. In the case of dual damascene processes, both the contacts and metal lines are formed of the same material. The uppermost metal level may be a pad level in which bond pads for external connections are disposed. The number of layers may depend on the process. For example, a BEOL dielectric layer may include five ILD layers. Other number of ILD layers may also be useful.

The base dielectric layer may be any dielectric layer of the BEOL dielectric layer. The dielectric layer may be the first contact level dielectric layer which is disposed over the transistors and other components formed in the FEOL processes. The dielectric layer serves as a base on which an integrated thin film magnetic device is formed using 3-D printing. The magnetic device may be an integrated solenoid or toroid device. Other types of magnetic devices formed by 3-D printing may also be useful.

In one embodiment, the thin film magnetic device includes a magnetic core plate 120 disposed on the base dielectric layer. For example, the magnetic core plate is disposed in a magnetic device region which is disposed within the BEOL dielectric layer. The magnetic core plate, in one embodiment, is surrounded by a metal winding. The metal winding includes interconnected lower and upper layers 133 and 135. For example, the metal winding is a two-layered metal winding. The magnetic core plate, for example, may be formed of nickel iron. Other suitable types of material with high permeability may also be useful. For example, the magnetic core plate may be formed of nickel, cobalt, iron based alloys or a combination thereof. The integrated solenoid or toroid device, in one embodiment, has a vertical resolution of up to 10 μm. The magnetic core plate, for example, may be about 10 μm thick. Other thicknesses may also be useful.

As for the metal winding, it may be a copper metal winding. In one embodiment, the metal winding may be pure copper metal winding. Other metallic material for the metal winding may also be useful. For example, the metal winding may be a copper-aluminum based alloy. In one embodiment, each of the lower and upper layers of the metal winding may be about 20 μm thick. Other thicknesses may also be useful. The magnetic core plate and metal winding may be further surrounded by a dielectric layer 124 as illustrated. For example, a patterned second dielectric layer is disposed on the base or first dielectric layer 122 and surrounds the magnetic core plate and metal winding. The patterned second dielectric layer separates the lower and upper layers of the metal winding and the magnetic core plate. The second dielectric layer, for example, may be formed of polyimide. Other suitable types of dielectric material may also be useful. For example, the dielectric layer may be formed of benzocyclobutene (BCB). The integrated inductor, in one embodiment, has a size less than 1 mm². Additionally, the horizontal feature size may be as small as about 50 μm.

Figure 2A:
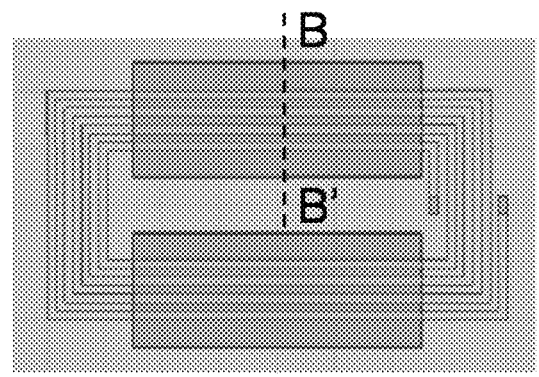
FIGS. 2a-2b show top and cross-sectional views of a portion of another embodiment of a device.
Figure 2B:
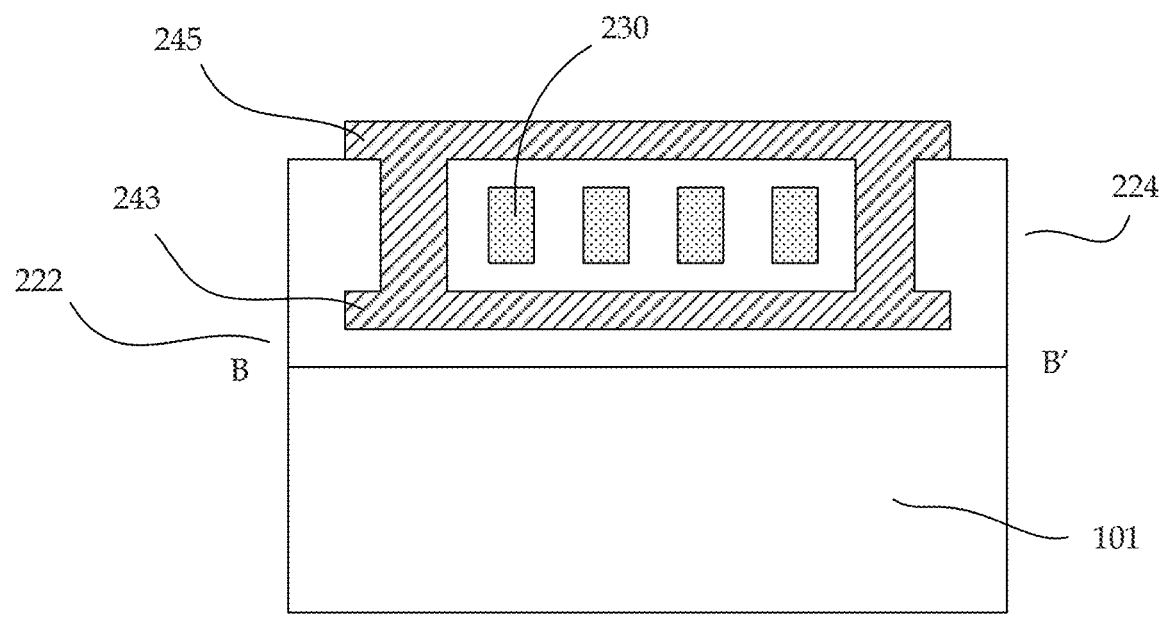

FIGS. 2*a*-2*b* show top and cross-sectional views of a portion of another embodiment of a device 200 respectively. The device, in one embodiment, is an integrated magnetic device. The magnetic device, for example, is an integrated inductor. Other types of devices may also be useful. As illustrated, the integrated magnetic device includes a planar spiral design. The device includes a substrate 101. The substrate, for example, is a silicon substrate. Other suitable types of substrates, such as silicon germanium, germanium, gallium arsenide, or crystal-on-insulator (COI) such as silicon-on-insulator (SOI), are also useful. The substrate may include logic components such as complementary metal oxide semiconductor (CMOS) transistors. The logic components may be formed using front-end-of-line (FEOL) CMOS logic processes.

A base dielectric layer 222 may be disposed on the substrate. The base dielectric layer may be part of a back-end-of-line (BEOL) dielectric layer. A BEOL dielectric layer may include a plurality of inter-level dielectric layers (ILDs). An ILD layer includes a via level dielectric layer below a metal level dielectric layer. The via level and metal level dielectric layers may be silicon oxide layers formed by chemical vapor deposition (CVD). Contacts are formed in the via level dielectric layer while metal lines are formed in the metal level dielectric layer. The contacts and metal lines may be formed of tungsten or copper.

An ILD level may be formed by single damascene, dual damascene or reactive ion etch (ME) or a combination of different processes. The uppermost metal level may be a pad level in which bond pads for external connections are disposed. The number of layers may depend on the process. For example, a BEOL dielectric layer may include five ILD layers. Other number of ILD layers may also be useful.

The base dielectric layer may be any dielectric layer of the BEOL dielectric layer. The dielectric layer may be the first contact level dielectric layer which is disposed over the transistors and other components formed in the FEOL processes. The dielectric layer serves as a base on which an integrated thin film magnetic device is formed using 3-D printing.

In one embodiment, the thin film magnetic device includes metal windings 230 disposed on the base dielectric layer. For example, the metal windings are disposed in a magnetic device region which is disposed within the BEOL dielectric layer. The metal windings are surrounded by a magnetic core. In one embodiment, the magnetic core includes interconnected lower and upper layers 243 and 245. For example, the magnetic core is a two-layered magnetic core. The magnetic core, for example, may be formed of nickel iron. Other suitable types of material with high permeability may also be useful. For example, the magnetic core may be formed of nickel, cobalt, iron based alloys or a combination thereof. In one embodiment, each of the lower and upper layers of the magnetic core may be about 10 μm thick. Other thicknesses may also be useful. The integrated planar spiral magnetic device, for example, has a vertical resolution of up to 10 μm.

As for the metal windings, it may be a copper metal winding. In one embodiment, the metal windings may be formed of pure copper. Providing a non-pure metal windings may also be useful. Other metallic material may also be useful. For example, the metal winding may be a copper-aluminum based alloy. The metal winding may be about 20 μm thick. Other thicknesses may also be useful. The magnetic core plate and metal windings may be further surrounded by a dielectric layer 224. For example, a patterned second dielectric layer 224 is disposed on the base or first dielectric layer and surrounds the magnetic core and metal windings. The patterned second dielectric layer separates the lower and upper layers of the magnetic core and the metal windings. The dielectric layer, for example, may be formed of polyimide. Other suitable types of dielectric material may also be useful.

FIGS. 3*a*-3*f* show cross-sectional views of an exemplary process 300 for forming a device. The device, for example, includes an integrated magnetic device similar to that described in FIGS. 1*a*-1*b*. Common elements may not be described or described in detail.

Figure 3A:
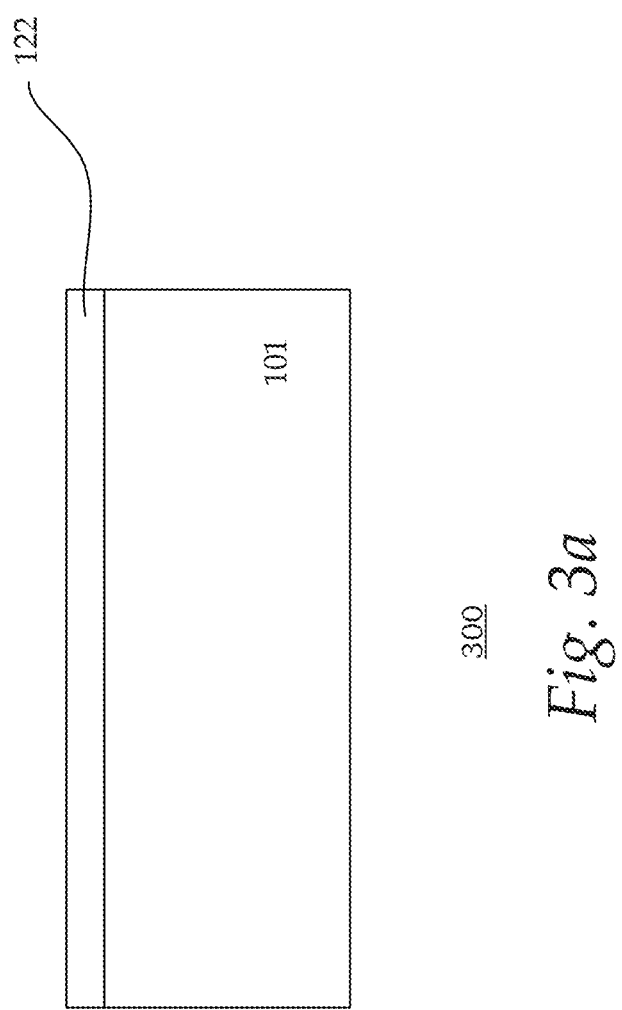

Referring to FIG. 3*a*, a substrate 101 is provided. The substrate, for example, is a silicon substrate. Other suitable types of substrates, such as silicon germanium, germanium, gallium arsenide, or crystal-on-insulator (COI) such as silicon-on-insulator (SOI), are also useful. In one embodiment, the substrate includes CMOS circuit components. For example, the substrate is a CMOS substrate. Providing the substrate with other logic components may also be useful. In one embodiment, the substrate is provided with a base or first dielectric layer 122 formed thereon. The dielectric layer, for example, may be a silicon oxide layer. The first dielectric layer may be part of a back-end-of-line (BEOL) dielectric layer. For example, the first dielectric layer serves as a first contact level dielectric layer of a back-end-of-line (BEOL) process. Providing other dielectric layers may also be useful. The thickness of the first dielectric layer, for example, is about 10 μm. Other suitable thickness may also be useful. The first dielectric layer, for example, may have a substantially planar top surface.

Figure 3B:
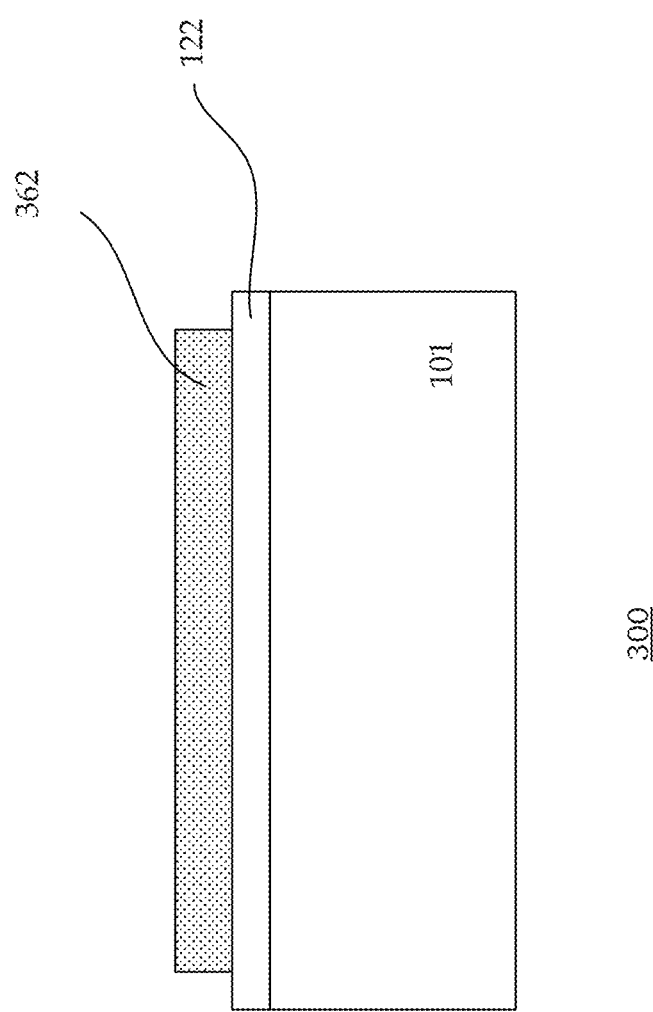
Figure 3C:
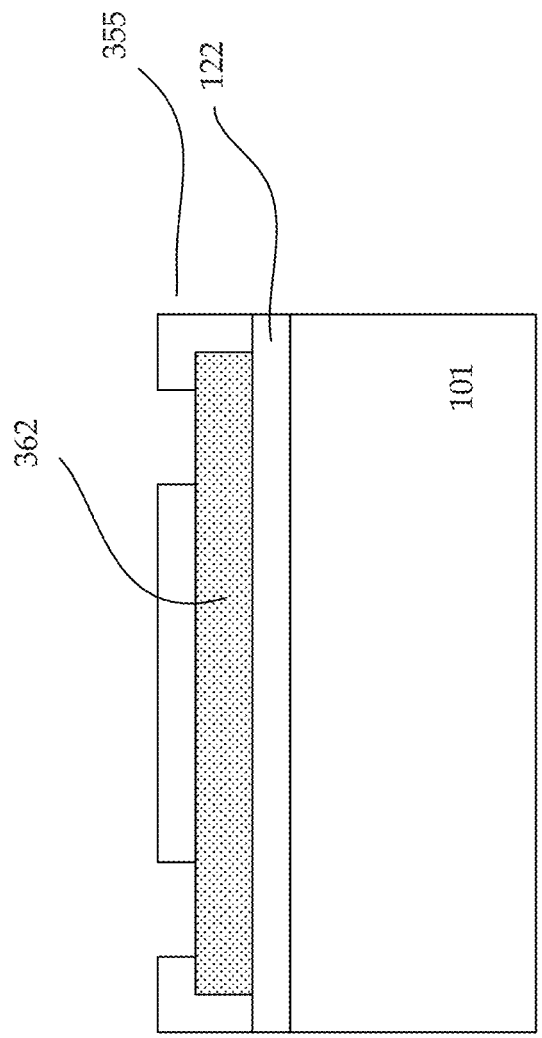

An integrated solenoid or toroid is formed on the device using 3D printing techniques. As shown in FIG. 3b, a first or lower metal layer 362 is formed over the substrate. In one embodiment, the first metal layer may be formed with its peripheral sides having a gap from the peripheral sides of the substrate. In one embodiment, the metal layer is formed by spray coating a metal powder on the first dielectric layer. The metal layer, in one embodiment, is formed by spray coating a gas atomized metal powder at room temperature. The gas atomized metal powder, for example, may be spray coated at room temperature in a few seconds. The thickness of the metal powder spray coated onto the substrate, for example, is about 20 μm. Other suitable thickness may also be useful. For example, the thickness of the metal powder may be about 5 μm to 45 μm. The powder particles have a spherical shape and high packing density, in order to establish a good flow property which enables uniform and regular powder thickness. During the spray coating, the metal powder may be accelerated in a high-pressure gas jet and distributed uniformly across the surface of the substrate. The metallic powder, for example, may be copper (Cu). Other suitable types of metallic material for forming a metal winding of a magnetic device may also be useful. For example, the metallic powder may be a copper-aluminum based alloy.

Selective laser melting or sintering (SLM or SLS) is then performed on the metal powder to form the first metal layer. For example, a high-powered laser or electron beam is employed to selectively scan and fuse the metal powder into the desired shape until a fully dense metal layer is formed. The scan speed may be in the range of 1-20 cm per second. In one embodiment, the process for forming the integrated solenoid or toroid using the 3D printing may be performed in a completely sealed chamber with a vacuum or inert environment to consolidate the metal powder to a high density. After an inherently rapid cooling down, excess metal powder which is not fused may be removed, leaving the first metal layer on the substrate. For example, the excess metal powder may be removed by gas jetting. As shown, a top surface of the first dielectric layer which is not covered by the first metal layer is exposed.

The process continues with forming a patterned second dielectric layer 355 over the substrate. The second dielectric layer may be formed by spray coating dielectric powder over the substrate. In one embodiment, a gas atomized dielectric powder is spray coated over the substrate. In one embodiment, the gas atomized dielectric powder is spray coated onto the first metal layer and the exposed top surface of the first dielectric layer. The dielectric powder is spray coated such that trenches or openings are formed in the second dielectric layer. The thickness of the dielectric powder spray coated onto the first metal layer, for example, is about 10 μm from a top surface of the first metal layer. Other suitable thickness may also be useful. The dielectric powder, for example, may be a dielectric polymer powder such as polyimide. Other suitable types of dielectric polymer may also be useful. For example, the dielectric powder may be a photo-sensitive dielectric polymer such as benzocyclobutene (BCB). The dielectric layer serves as an insulator between metal layers. Additionally, the dielectric layer provides a planarized surface for deposition of subsequent magnetic film layers.

Selective laser exposure is then performed on the dielectric polymer powder to form the second dielectric layer. For example, a laser or electron beam is employed to selectively expose and cure the dielectric powder into the desired shape. The exposure, for example, takes only a few seconds. After exposure, excess polymer powder which is not exposed may be removed, leaving the second dielectric layer on the substrate. For example, the excess polymer powder which is not exposed may be removed by developing. The second dielectric layer fuses with the first dielectric layer on which it is disposed.

Figure 3D:
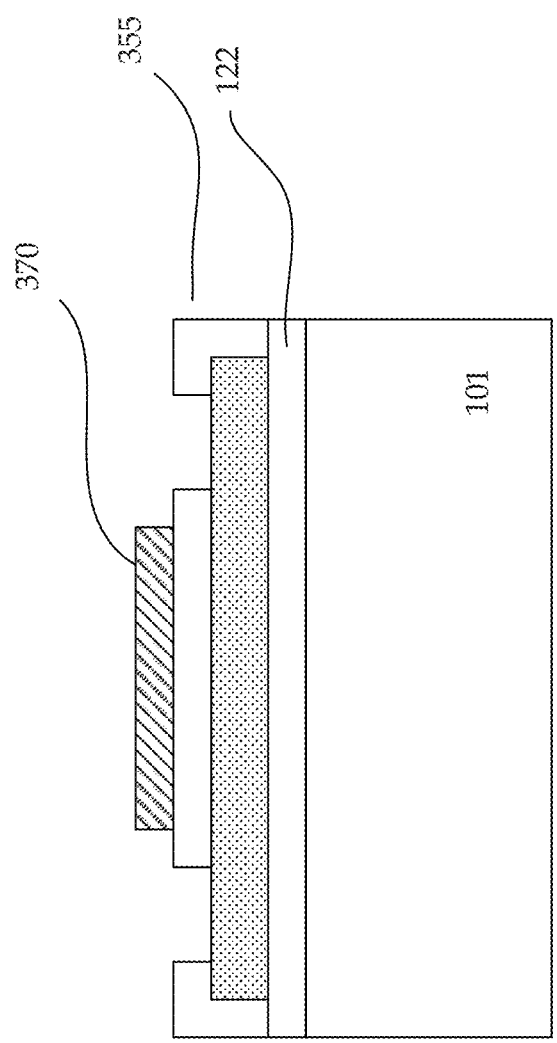

A magnetic core 370 is then formed on the substrate as shown in FIG. 3d. In one embodiment, the magnetic core is formed by spray coating a magnetic powder over the substrate. In one embodiment, a gas atomized magnetic powder is spray coated on a top surface of the second dielectric layer. In one embodiment, the gas atomized magnetic powder is spray coated on a central portion on the top surface of the second dielectric layer. The gas atomized magnetic powder may be spray coated in only a few seconds. The thickness of the magnetic powder spray coated over the substrate, for example, is about 10 μm. For example, a thick magnetic powder is spray coated onto the second dielectric layer. Other suitable thickness may also be useful. For example, the thickness of the magnetic powder spray coated over the substrate may be about 5 μm to 45 μm. The magnetic powder particles have a spherical shape and high packing density, in order to establish a good flow property which enables a uniform and regular powder thickness. The magnetic powder, for example, may be nickel iron. Other suitable types of magnetic material with high permeability for forming a magnetic core of the magnetic device may also be useful. For example, the magnetic material may be nickel, cobalt, iron based alloys or a combination thereof.

Selective laser sintering is then performed on the magnetic powder to form the magnetic core of the magnetic device. For example, a high-powered laser or electron beam is employed to selectively scan and fuse the magnetic powder into the desired shape until a fully dense magnetic film layer is formed. In one embodiment, the scan speed may be in the range of 1-20 cm per second. The process may be performed in a completely sealed chamber with a high vacuum or inert environment to consolidate the magnetic powder to a high density. After an inherently rapid cooling down, excess powder which is not fused may be removed, leaving the magnetic core film layer over the substrate. For example, the excess magnetic powder may be removed by gas jetting.

Referring to FIG. 3e, a patterned third dielectric layer 357 is formed over the substrate. The third dielectric layer may be formed by spray coating dielectric powder over the substrate. In one embodiment, a gas atomized dielectric powder is spray coated on the magnetic core and the second dielectric layer. The thickness of the dielectric powder spray coated over the substrate, for example, is about 10 μm from a top surface of the magnetic core layer. Other suitable thickness may also be useful. The dielectric powder, in one embodiment, is dielectric polymer powder. The dielectric material, for example, may be polyimide. Other suitable types of dielectric material may also be useful. For example, the dielectric powder may be benzocyclobutene (BCB). The dielectric layer serves as an insulator between the magnetic layer and a subsequently formed upper metal layer. Additionally, it provides a planarized surface for deposition of the subsequent upper metal layer.

Selective laser exposure is then performed on the dielectric polymer powder to form the third dielectric layer. For example, a laser or electron beam is employed to selectively expose and cure the dielectric powder into the desired shape. The exposure, for example, takes only a few seconds. After exposure, excess polymer powder, which is not exposed may be removed, leaving the third dielectric layer. For example, the excess polymer powder is removed by developing. The third dielectric layer fuses with the second dielectric layer on which it is disposed. As shown, the third dielectric layer surrounds and covers the magnetic core. The third dielectric layer is formed such that openings 382 and 384 are formed through the second and third dielectric layers.

Figure 3F:
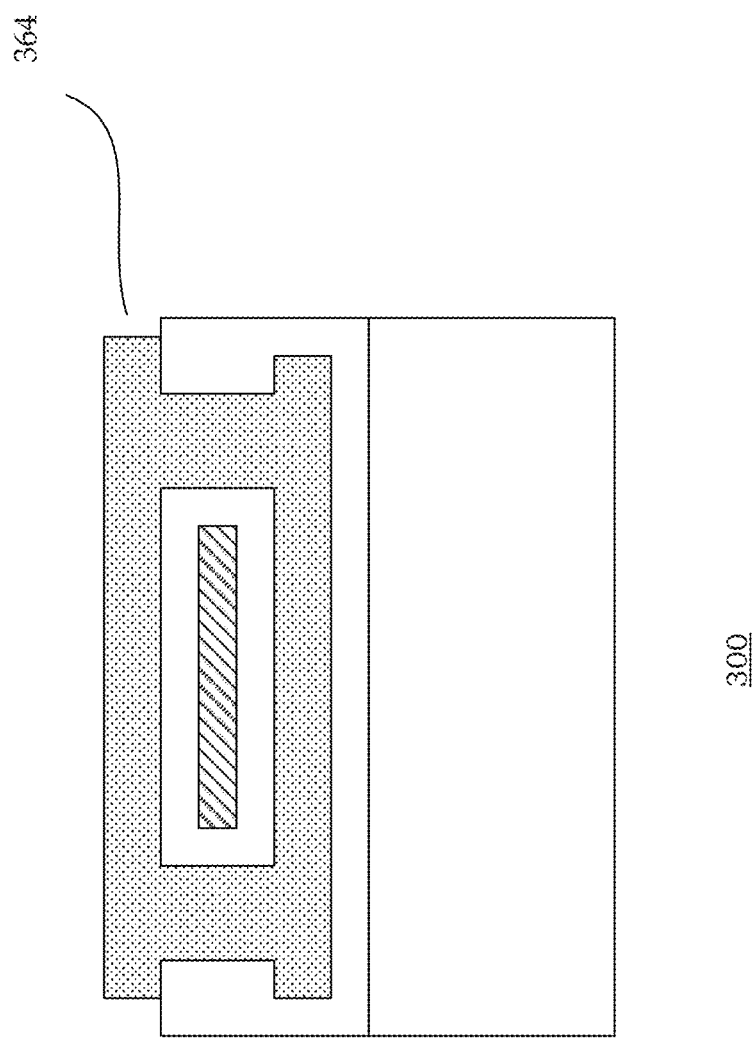

The process continues to form a second or upper metal layer 364 over the substrate as shown in FIG. 3f. In one embodiment, the second metal layer is formed by spray coating metal powder on the third dielectric layer, filling the openings in the dielectric layer. For example, the metal powder fills the openings in the second and third dielectric layer. In one embodiment, a gas atomized metal powder is spray coated over the third dielectric layer. For example, the gas atomized metal powder is spray coated at room temperature in only a few seconds. The thickness of the metal powder spray coated over the substrate, for example, is about 20 µm from a top surface of the third dielectric layer. Other suitable thickness may also be useful. For example, the thickness of the metal powder spray coated over the substrate is about 5 µm to 45 µm from the top surface of the third dielectric layer. The powder particles have a spherical shape and high packing density, in order to establish a good flow property which enables a uniform and regular powder thickness.

The metal powder, for example, may be copper (Cu). In one embodiment, the metal powder may be pure Cu. The metallic material for forming the second metal layer, in one embodiment, is the same as the first metal layer to form a two-layer metal winding surrounding the magnetic core. Other suitable types of metallic material for forming a metal winding of a magnetic device may also be useful. For example, the metal winding may be formed of a copper-aluminum based alloy. Selective laser melting or sintering is then performed on the metal powder to form the second metal layer. For example, a high-powered laser or electron beam is employed to selectively scan and fuse the metal powder into the desired shape until a fully dense metal layer is formed. The scan speed, for example, may be in the range of 1-20 cm per second. After an inherently rapid cooling down, excess powder which is not fused may be removed, leaving the second metal layer on the substrate. The process continues, for example, to form additional dielectric layers and chemical mechanical polishing (CMP) in a BEOL process.

FIGS. 4a-4e show cross-sectional views of an exemplary process 400 for forming another device. The device, for example, includes an integrated magnetic device similar to that described in FIGS. 2a-2b. Common elements may not be described or described in detail.

Figure 4A:
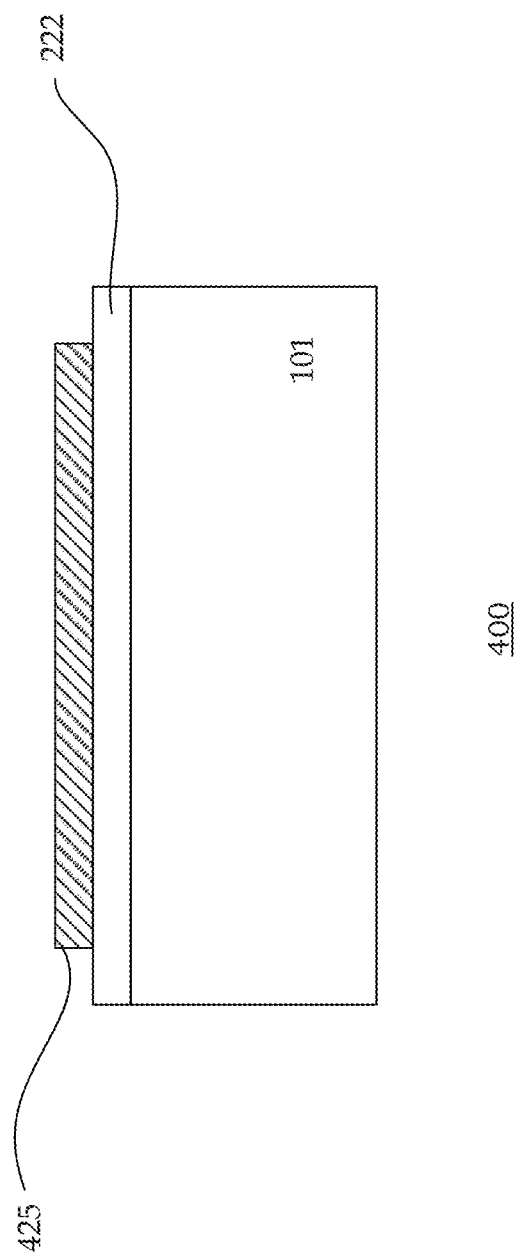

Referring to FIG. 4a, a substrate 101 is provided. The substrate, for example, is a silicon substrate. Other suitable types of substrates, such as silicon germanium, germanium, gallium arsenide, or crystal-on-insulator (COI) such as silicon-on-insulator (SOI), are also useful. In one embodiment, the substrate includes CMOS circuit components. For example, the substrate is a CMOS substrate. Providing the substrate with other circuit components may also be useful. In one embodiment, the substrate is provided with a base or first dielectric layer 222 formed thereon. The dielectric material, for example, may be silicon oxide. The first dielectric layer may be part of a back-end-of-line (BEOL) dielectric layer. For example, the first dielectric layer serves as a first contact level dielectric layer of a back-end-of-line (BEOL) process. Providing the first dielectric layer formed of other dielectric material may also be useful. The thickness of the first dielectric layer, for example, is about 10 µm. Other suitable thickness may also be useful. The first dielectric layer, for example, may have a substantially planar top surface.

An integrated planar spiral magnetic is formed on the device using 3D printing techniques. As shown in FIG. 4a, a first or lower layer of a magnetic core 425 is formed on the substrate. In one embodiment, the first layer of the magnetic core may be formed with its peripheral sides having a gap from the peripheral sides of the substrate. In one embodiment, the first layer of the magnetic core is formed by spray coating a magnetic powder over the substrate. In one embodiment, a gas atomized magnetic powder is spray coated onto the first dielectric layer. For example, the gas atomized magnetic powder may be spray coated in only a few seconds. The thickness of the magnetic powder spray coated onto the first dielectric layer, for example, is about 10 µm. Other suitable thickness may also be useful. For example, the thickness of the magnetic powder may be about 5 µm to 45 µm. The magnetic powder, for example, may be nickel iron. Other suitable types of magnetic material for forming a magnetic core of a magnetic device may also be useful. For example, the magnetic powder may be nickel, cobalt, iron based alloys or a combination thereof.

Selective laser sintering is then performed on the magnetic powder to form the first layer of the magnetic core. For example, a high-powered laser or electron beam is employed to selectively scan and fuse the magnetic powder into the desired shape until a fully dense magnetic film layer is formed. Excess magnetic powder which is not fused is removed.

Figure 4B:
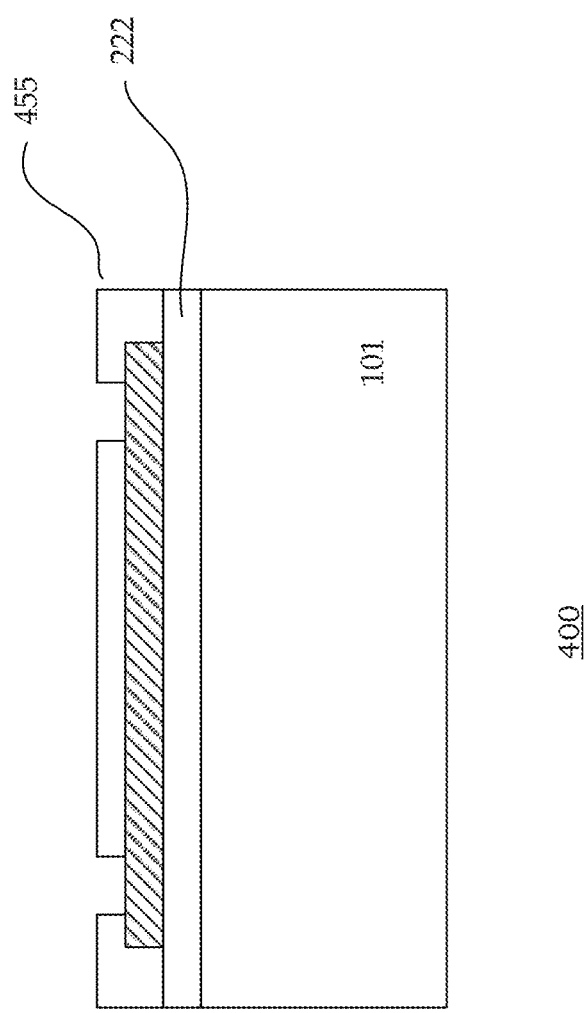

The process continues with forming a patterned second dielectric layer 455 over the substrate as shown in FIG. 4b. The second dielectric layer may be formed by spray coating dielectric powder over the substrate. In one embodiment, a gas atomized dielectric powder is spray coated onto the first layer of the magnetic core and the exposed top surface of the first dielectric layer. The dielectric powder is spray coated such that trenches or openings are formed in the second dielectric layer. The thickness of the dielectric powder spray coated onto the first layer of the magnetic core, for example, is about 10 µm from a top surface of the first layer of the magnetic core. Other suitable thickness may also be useful. The dielectric powder, for example, may be a dielectric polymer powder such as polyimide. Other suitable types of photo-sensitive dielectric material may also be useful. For example, the second dielectric powder may be BCB. The dielectric layer serves as an insulator between the first magnetic layer and a subsequently formed metal layer. Additionally, it provides a planarized surface for deposition of the subsequently formed metal layer.

Selective laser sintering is then performed on the dielectric powder to form the second dielectric layer. For example, a laser or electron beam is employed to expose and cure the dielectric powder into the desired shape. The exposure, for example, takes only a few seconds. After exposure, excess polymer powder which is not exposed may be removed, leaving the second dielectric layer. For example, the excess polymer powder which is not exposed may be removed by developing. The second dielectric layer fuses with the first dielectric layer on which it is disposed.

Figure 4C:
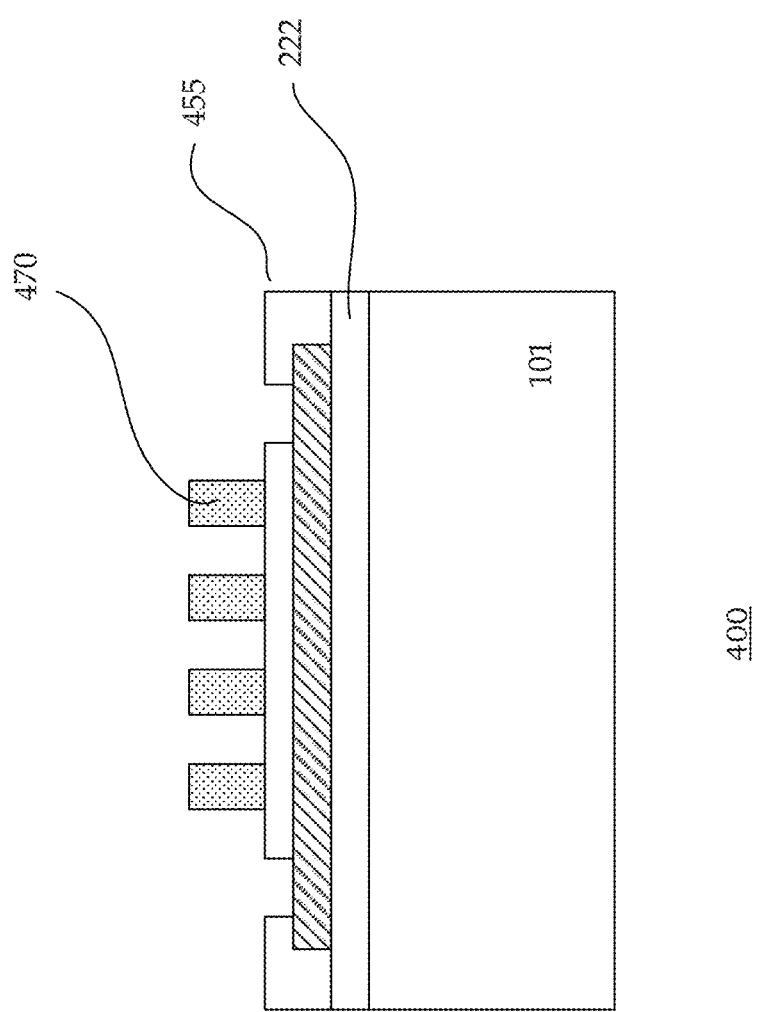

Metal windings 470 are then formed on the substrate as shown in FIG. 4c. In one embodiment, the metal windings are formed by spray coating a metal powder over the substrate. In one embodiment, a gas atomized metal powder is spray coated over the substrate. For example, the metal powder is spray coated on a central portion on a top surface of the second dielectric layer. The thickness of the metal powder spray coated over the substrate, for example, is about 20 μm. Other suitable thickness may also be useful. For example, the thickness of the metal powder on the substrate may be about 5 μm to 45 μm. The metal powder, for example, may be copper (Cu). In one embodiment, the metal powder may be pure Cu. Other suitable types of metallic material may also be useful. For example, the metal powder may be a copper-aluminum based alloy.

Selective laser melting or sintering is then performed on the metallic powder to form the metal winding of the magnetic device. For example, a high-powered laser or electron beam is employed to selectively scan and fuse the metal powder into the desired shape until a fully dense metal layer is formed. The scan speed may be in the range of 1-20 cm per second. In one embodiment, the process for forming the integrated planar spiral magnetic using the 3D printing may be performed in a completely sealed chamber with a vacuum or inert environment to consolidate the metal powder to a high density. After an inherently rapid cooling down, excess metal powder which is not fused may be removed, leaving the metal windings on the substrate. For example, the excess metal powder may be removed by gas jetting.

Referring to FIG. 4d, a patterned third dielectric layer 457 is formed over the substrate. The third dielectric layer may be formed by spray coating dielectric powder on the metal windings and the second dielectric layer. In one embodiment, a gas atomized dielectric powder is spray coated over the metal windings and the second dielectric layer. As shown, the dielectric powder fills the gaps between the metal windings. The thickness of the dielectric powder spray coated over the substrate, for example, is about 10 μm from a top surface of the metal windings. Other suitable thickness may also be useful. The dielectric powder, for example, may be polyimide. Other suitable types of dielectric material may also be useful. Selective laser exposure is then performed on the dielectric powder to form the third dielectric layer. The third dielectric layer fuses with the second dielectric layer on which it is disposed. As shown, the third dielectric layer surrounds and covers the metal winding. The third dielectric layer is formed such that openings 482 and 484 are formed through the second and third dielectric layers.

Figure 4E:
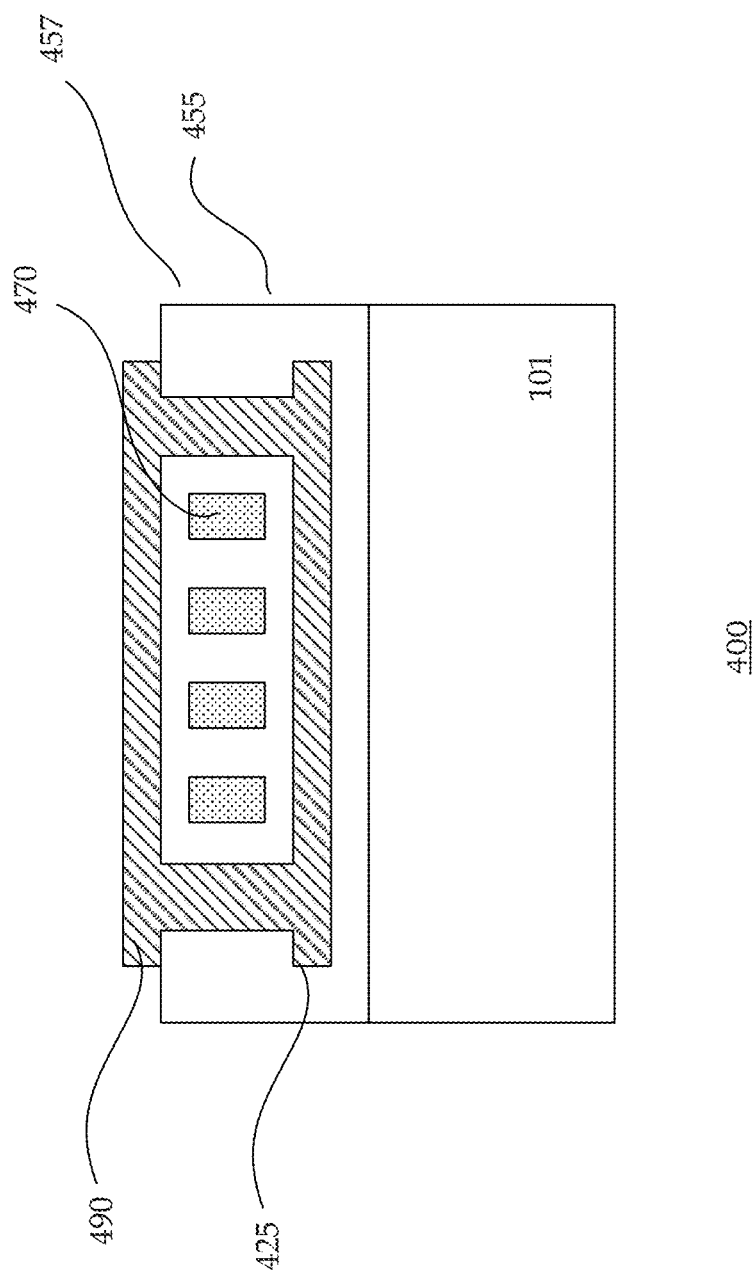

The process continues to form a second or upper layer of the magnetic core 490 over the substrate as shown in FIG. 4e. In one embodiment, the second layer of the second magnetic core is formed by spray coating magnetic powder on the third dielectric layer, filling the openings in the dielectric layer. In one embodiment, a gas atomized magnetic powder is spray coated on the third dielectric layer. For example, the magnetic powder fills the opening in the second and third dielectric layer. The thickness of the magnetic powder spray coated over the substrate, for example, is about 10 μm from the top surface of the third dielectric layer. Other suitable thickness may also be useful.

For example, the thickness of the magnetic powder may be about 5 μm to 45 μm. The magnetic powder, for example, may be nickel iron. For example, the magnetic powder for forming the second layer of the magnetic core is the same as that for forming the first layer of the magnetic core to form a two-layer magnetic core surrounding the metal windings. Other suitable types of magnetic material for forming a magnetic core of a magnetic device may also be useful.

Selective laser melting or sintering is then performed on the magnetic powder to form the second layer of the magnetic core. For example, a high-powered laser or electron beam is employed to selectively scan and fuse the magnetic powder into the desired shape until a fully dense magnetic film layer is formed. Excess magnetic powder which is not fused is removed. The process continues, for example, to form additional dielectric layers and chemical mechanical polishing (CMP) in a BEOL process.

The process as described above using 3D printing techniques for forming the integrated magnetic devices overcome geometric limitations of conventional planar CMOS fabrication processes. The process as described in FIGS. 3a-3f and FIGS. 4a-4e enable much faster material deposition speed, for example, compared to the standard CMOS fabrication processes. The faster material deposition speed allows for much thicker material thickness and thickness for the magnetic core and metal winding. The improvement in geometry of the magnetic devices may lead to improved electrical performance for the integrated thin-film magnetics. For example, the improved electrical performance includes smaller DC resistance and larger quality factor. Additionally, process as described is compatible with standard CMOS manufacturing process. Furthermore, spray coating of the magnetic material has a faster process speed compared with standard RF sputtering, which results in short process time and large throughput during mass production.

The embodiments as described may be implemented in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a device with an integrated magnetic component using three-dimensional printing, the method comprising:
    providing a substrate with a first dielectric layer;
    forming a first layer of a metal winding on the first dielectric layer by spray coating a metal powder over the first dielectric layer and selective laser sintering the metal powder;
    forming a second dielectric layer over the first layer of the metal winding and the first dielectric layer;
    patterning the second dielectric layer to include a first plurality of openings extending to the first layer of the metal winding;
    forming a magnetic core on the second dielectric layer by spray coating a magnetic powder over the second dielectric layer and selective laser sintering the magnetic powder;
    forming a third dielectric layer over the magnetic core and the second dielectric layer;

patterning the third dielectric layer to include a second plurality of openings connected with the first plurality of openings; and forming a second layer of the metal winding on the third dielectric layer by spray coating a metal powder over the substrate and selective laser sintering the metal powder, wherein the second dielectric layer and the third dielectric layer insulate the first and second layers of the metal winding from the magnetic core, the spray coating of the metal powder of the second layer of the metal winding fills the first plurality of openings and the second plurality of openings such that, after selective layer sintering, and the first and second layers of the metal winding are interconnected and surround the magnetic core.

2. The method of claim 1 wherein the second dielectric layer is formed over the first layer of the metal winding by spray coating a dielectric polymer powder over the first layer of the metal winding and performing selective laser exposure and curing on the dielectric polymer powder.

3. The method of claim 2 wherein the third dielectric layer is formed over the magnetic core and the second dielectric layer by spray coating a dielectric polymer powder over the magnetic core and the second dielectric layer and performing selective laser exposure and curing on the dielectric polymer powder.

4. The method of claim 3 wherein a thickness of the dielectric polymer powder for forming the second dielectric layer and the third dielectric layer is about 10 μm.

5. The method of claim 1 wherein the first dielectric layer comprises silicon oxide, and the second dielectric layer and the third dielectric layer each comprise polyimide or benzocyclobutene.

6. The method of claim 1 wherein the first dielectric layer comprises silicon oxide, and the second dielectric layer comprises polyimide or benzocyclobutene.

7. The method of claim 1 wherein the magnetic powder and the metal powder are spray coated in a sealed chamber with a vacuum or inert environment.

8. The method of claim 1 wherein selective laser sintering the metal powder comprises:

scanning a high powered laser beam to selectively scan and fuse the metal powder.

9. The method of claim 1 wherein selective laser sintering the magnetic powder comprises:

scanning a high powered laser beam to selectively scan and fuse the magnetic powder.

10. The method of claim 1 wherein the device has a toroidal shape.

11. The method of claim 1 wherein the metal powder and the magnetic powder that are spray coated comprise gas atomized powders.

12. The method of claim 1 wherein a thickness of the metal powder for forming the first layer and the second layer of the metal winding is about 20 μm.

13. The method of claim 1 wherein a thickness of the magnetic powder for forming the magnetic core is about 10 μm.

14. The method of claim 1 wherein the magnetic core comprises nickel, cobalt, an iron-based alloy, or a combination thereof, and the metal winding comprises copper or a copper-aluminum alloy.

* * * * *